(12) United States Patent
Yun

(10) Patent No.: US 8,248,096 B2
(45) Date of Patent: Aug. 21, 2012

(54) TEST MODE SIGNAL GENERATING DEVICE

(75) Inventor: Tae Sik Yun, Ichon (KR)

(73) Assignee: SK Hynix Inc., Gyeonggi-do (KR)

( * ) Notice: Subject to any disclaimer, the term of this patent is extended or adjusted under 35 U.S.C. 154(b) by 282 days.

(21) Appl. No.: 12/637,198

(22) Filed: Dec. 14, 2009

(65) Prior Publication Data
US 2011/0025364 A1    Feb. 3, 2011

(30) Foreign Application Priority Data
Jul. 30, 2009   (KR) .................. 10-2009-0070091

(51) Int. Cl.
*G01R 31/02*      (2006.01)
(52) U.S. Cl. .............. 324/762.01; 714/718; 714/724; 714/733; 365/201
(58) Field of Classification Search .......... 714/30, 714/730, 798, 718, 724, 733; 365/201; 324/762.01–762.1
See application file for complete search history.

(56) References Cited

U.S. PATENT DOCUMENTS

| | | | |
|---|---|---|---|
| 5,553,025 A * | 9/1996 | Haraguchi | .................. 365/201 |
| 5,675,546 A | 10/1997 | Leung | |
| 6,415,406 B1 | 7/2002 | Kaiser et al. | |
| 6,581,174 B2 | 6/2003 | Stubbs | |
| 6,842,033 B1 | 1/2005 | Kim et al. | |
| 7,007,215 B2 | 2/2006 | Kinoshita et al. | |
| 2006/0059398 A1* | 3/2006 | Chang et al. | .................. 714/742 |
| 2008/0159029 A1* | 7/2008 | Park | .............................. 365/201 |

FOREIGN PATENT DOCUMENTS

| | | |
|---|---|---|
| JP | 01-173499 | 7/1989 |
| JP | 03-093099 | 4/1991 |
| JP | 2004-045090 | 2/2004 |
| KR | 10-0576460 | 4/2006 |

* cited by examiner

Primary Examiner — Jermele M Hollington
Assistant Examiner — Son Le
(74) Attorney, Agent, or Firm — William Park & Associates Ltd.

(57) ABSTRACT

Various embodiments of a test mode signal generating device are disclosed. The device includes first and second test mode signal generating units. The first test mode signal generating unit is configured to receive test address signals to generate a first test mode signal when a first mode conversion signal is enabled. The first test mode signal generating unit is also configured to enable a second mode conversion signal when the test address signals correspond to a first predetermined combination. The second test mode signal generating unit is configured to receive the test address signals to generate a second test mode signal when the second mode conversion signal is enabled. The second test mode signal generating unit is also configured to enable the first mode conversion signal when the test address signals correspond to a second predetermined combination.

16 Claims, 7 Drawing Sheets

FIG.8
324
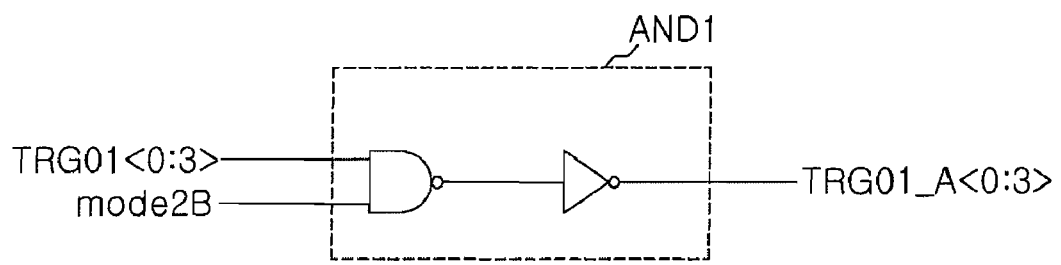
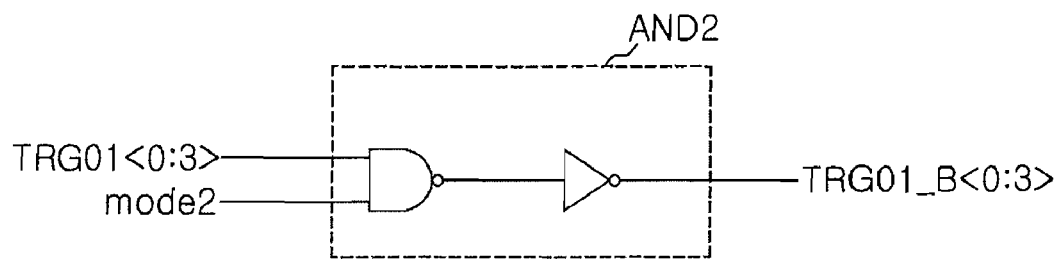

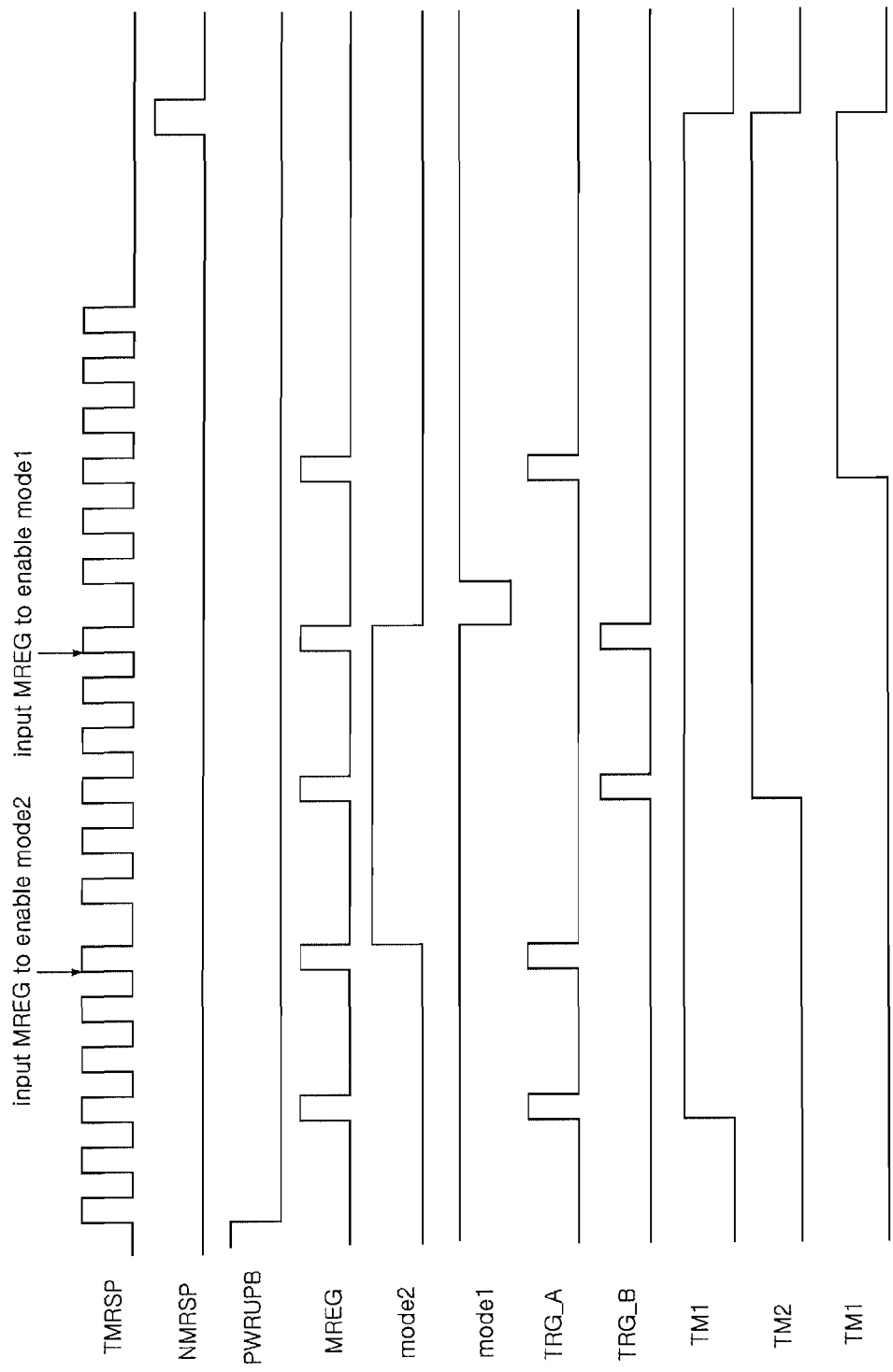

US 8,248,096 B2

TEST MODE SIGNAL GENERATING DEVICE

CROSS-REFERENCES TO RELATED APPLICATION

The present application claims priority under 35 U.S.C. 119(a) to Korean Application No. 10-2009-0070091, filed on Jul. 30, 2009 with the Korean Intellectual Property Office, which is incorporated herein by reference in its entirety.

BACKGROUND

1. Technical Field

Embodiments of the present invention relate to a test mode signal generating device, and more particularly, to a test mode signal generating device capable of generating a test mode signal by using an address signal, so that a semiconductor apparatus can perform a test operation.

2. Related Art

In general, to ensure a reliability of a semiconductor apparatus, various tests are performed during a manufacturing process or before shipping products. Since there are various performance tests to be conducted on the semiconductor apparatus, the testing involves setting a plurality of test modes in which the various performance tests are performed and performing the various tests on the semiconductor apparatus based on the predetermined test modes. In general, the semiconductor apparatus logically combines address signals to generate a test mode signal that can instruct the semiconductor apparatus to enter into a specific test mode.

FIG. 1 is a block diagram schematically showing a configuration of a conventional test mode signal generating device. The test mode signal generating device of FIG. 1 includes a control unit 10, an address decoder 20, and a test mode signal generating unit 30. The control unit 10 receives address signals MREG<0:6>, a normal MRS signal NMRSP, a test MRS signal TMRSP, and a power-up signal PWRUP. The control unit 10 generates transfer address signals TMREG<0:6> in response to the address signals MREG<0:6> when the test MRS signal TMRSP is enabled. The control unit 10 generates a reset signal TRSTPB by using the normal MRS signal NMRSP and the power-up signal PWRUP. The address decoder 20 decodes the transfer address signals TMREG<0:6> input from the control unit 10 and then generates test address signals TRG01<0:3>, TRG234<0:7> and TRG56<0:3>. The test mode signal generating unit 30 receives the test address signals TRG01<0:3>, TRG234<0:7> and TRG56<0:3> to generate a test mode signal TM. The test mode signal generating unit 30 includes a plurality of signal generating units 31, 32, 33 and 34 and generates a plurality of test mode signals TM. The test mode signals 'TM' are different from one another in their number of logic combinations of the test address signals TRG01<0:3>, TRG234<0:7> and TRG56<0:3>.

FIG. 2 is a diagram showing a configuration of one of the plurality of signal generating units 31 to 34 constituting the test mode signal generating unit 30 of FIG. 1. As shown in FIG. 2, the signal generating unit 31 includes first to third NMOS transistors Na to Nc, a first PMOS transistor Pa, and first to third inverters IVa to IVc. The first to third NMOS transistors Na to Nc receive test address signals TRG01<0>, TRG234<m> and TRG56<n> assigned to them through their gate terminals, respectively, where m is an integer greater than or equal to 0 and less than or equal to 7, and n is an integer greater than or equal to 0 and less than or equal to 3. The first PMOS transistor Pa receives the reset signal TRSTPB through its gate terminal. The assigned test address signals TRG01<0>, TRG234<m> and TRG56<n> determine whether the first to third NMOS transistors Na to Nc are turned on or not, respectively, and the first to third NMOS transistors Na to Nc apply a ground voltage VSS to a node C when the first to third NMOS transistors Na to Nc are all turned on. The first PMOS transistor Pa is turned on to apply an external voltage VDD to the node C when the reset signal TRSTPB is enabled at a logic low level. The first and second inverters IVa and IVb latch a voltage level of the node C, and the third inverter IVc outputs an inverted signal of the voltage level of the node C as the test mode signal TM. The signal generating unit 31 turns the node C to the ground voltage (VSS) level to enable the test mode signal TM when the assigned test address signals TRG01<0>, TRG234<m> and TRG56<n> are enabled. The signal generating unit 31 turns the node C to the external voltage (VDD) level to disable the test mode signal TM when the reset signal TRSTPB, which indicates an end of the test operation, is enabled.

All of the signal generating units of the test mode signal generating unit 30 have substantially the same configuration as that of the signal generating unit 31 of FIG. 2. In other words, all of the remaining signal generating units 32, 33, and 34 have substantially the same configuration as that of the signal generating unit 31 of FIG. 2.

In general, the address signals are input into the semiconductor apparatus through pads, and the number of input address signals used to generate the test mode signals is limited. For example, if seven input address signals are used to generate the test mode signal, the test mode signals that can instruct the semiconductor apparatus to enter into 128 different test modes can be generated. In this case, the number of the signal generating units will be 128.

In general, the semiconductor apparatus performs the various tests through various test modes in order to improve the reliability of product. However, since the number of address signals used to perform the test is limited, it is difficult to generate a greater number of test mode signals.

SUMMARY OF THE INVENTION

The embodiments of the present invention include a test mode signal generating device capable of generating an unlimited number of test mode signals by receiving as inputs a limited number of address signals.

In one embodiment of the present invention a test mode signal generating device includes: a first test mode signal generating unit configured to receive test address signals to generate a first test mode signal when a first mode conversion signal is enabled, and to enable a second mode conversion signal when a first predetermined combination of the test address signals are received; and a second test mode signal generating unit configured to receive the test address signals to generate a second test mode signal when a second mode conversion signal is enabled, and to enable the first mode conversion signal when a second predetermined combination of the test address signals are received.

In another embodiment of the present invention, a test mode signal generating device includes: a first test mode signal generating unit configured to generate a first test mode signal in response to test address signals, in a first test mode; and a second test mode signal generating unit configured to generate a second test mode signal in response to the test address signals, in a second test mode, wherein the first and second test modes are able to be converted to each other based on the test address signals.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention, and, together with the description, serve to explain the principles of the invention.

FIG. 8 is a diagram showing an exemplary configuration of the first selection unit of FIG. 7.

FIG. 9 is a timing diagram showing an exemplary operation of a test mode signal generating device.

DESCRIPTION OF THE EMBODIMENTS

Reference will now be made in detail to the exemplary embodiments consistent with the present invention, examples of which are illustrated in the accompanying drawings. Wherever possible, the same reference numbers will be used throughout the drawings to refer to the same or like parts.

Figure 3:
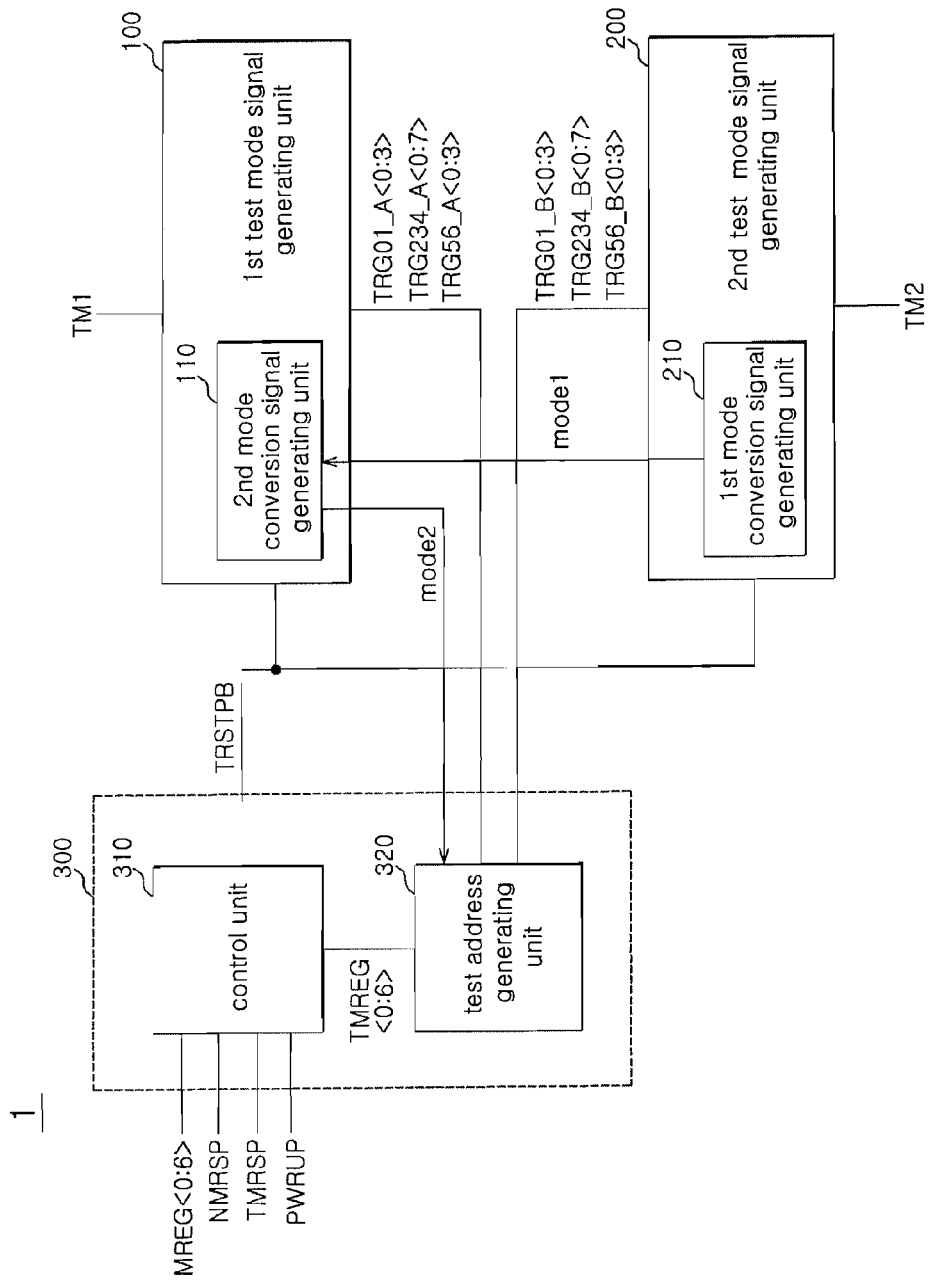
FIG. 3 is a block diagram schematically illustrating an exemplary configuration of a test mode signal generating device.

FIG. 3 is a block diagram schematically illustrating an exemplary configuration of a test mode signal generating device 1 according to various aspects of the present invention. As shown in FIG. 3, the test mode signal generating device 1 may include a first test mode signal generating unit 100, a second test mode signal generating unit 200, and a test control unit 300.

Figure 1:
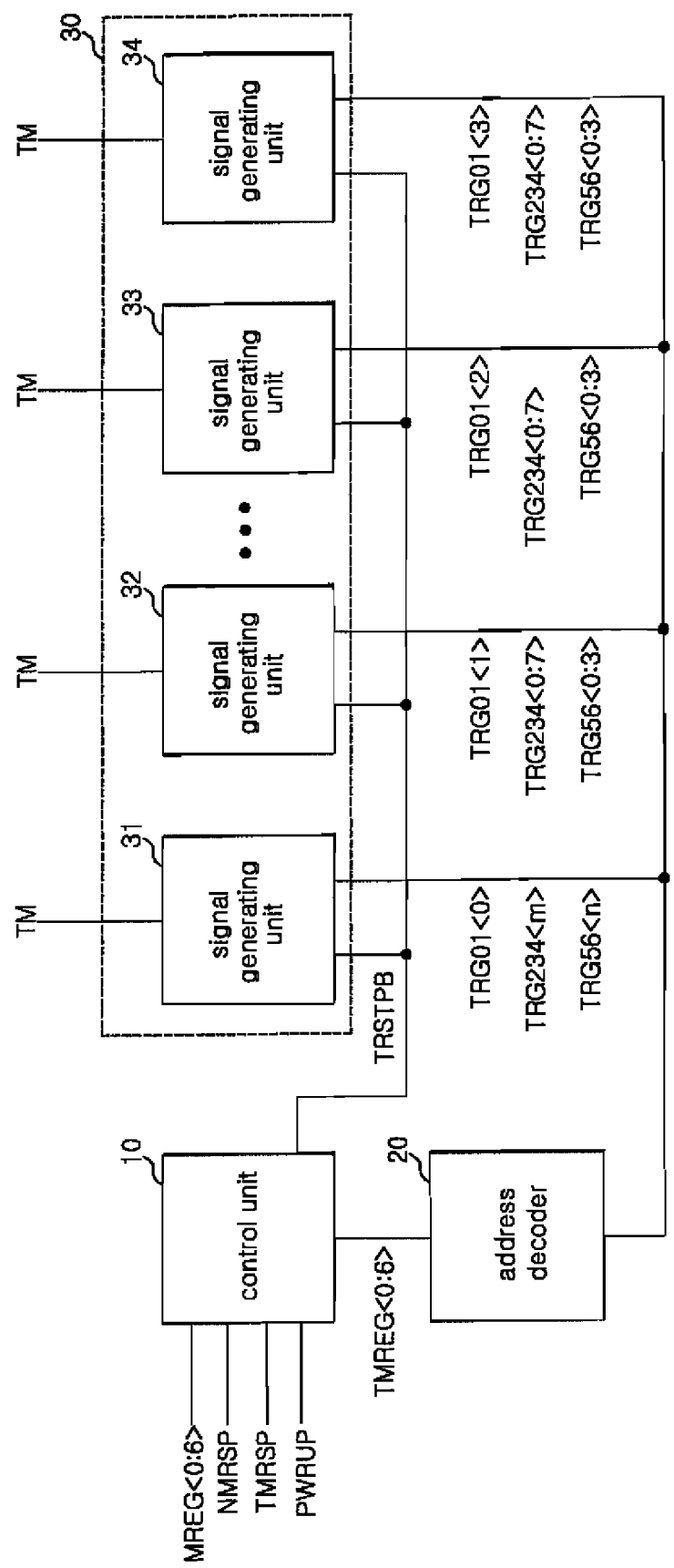
FIG. 1 is a block diagram, schematically illustrating a configuration of a conventional test mode signal generating device.
Figure 2:
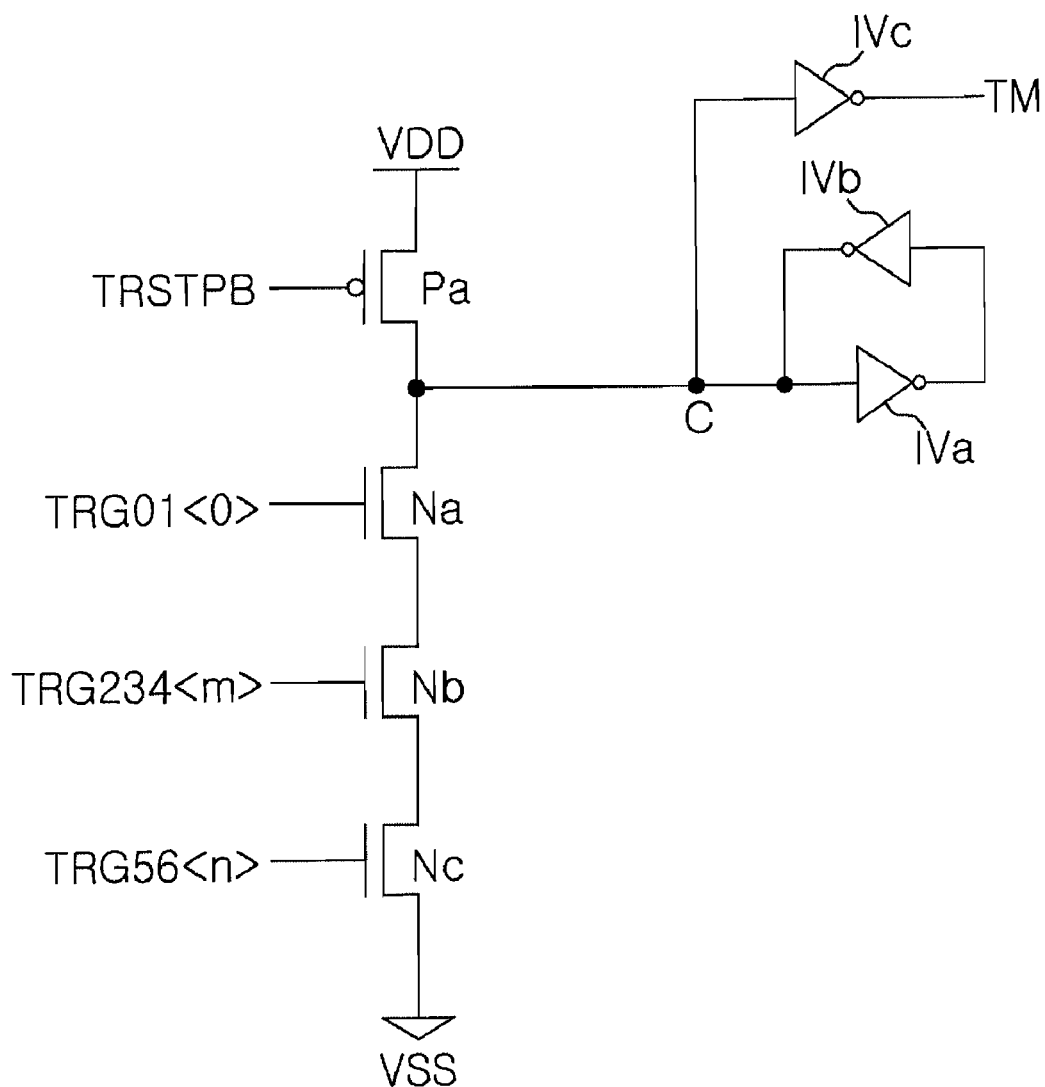
FIG. 2 is a circuit diagram showing a configuration of the signal generating unit of FIG. 1.

The first test mode signal generating unit 100 receives test address signals TRG01_A<0:3>, TRG234_A<0:7> and TRG56_A<0:3> to generate a first test mode signal TM1. The first test mode signal generating unit 100 also enables a second mode conversion signal mode2 when a predetermined combination of the test address signals TRG01_A<0:3>, TRG234_A<0:7> and TRG56_A<0:3> are input. The first test mode signal generating unit 100 may comprise at least one of multiple signal generating units (not shown) configured to generate the first test mode signal TM1 in response to the test address signals TRG01_A<0:3>, TRG234_A<0:7> and TRG56_A<0:3>. The first test mode signal generating unit 100 may also comprise a second mode conversion signal generating unit 110 configured to generate the second mode conversion signal mode2 in response to a predetermined combination of the test address signals TRG01_A<0:3>, TRG234_A<0:7> and TRG56_A<0:3>. According to various exemplary embodiments, the signal generating unit may have substantially the same configuration as that of the signal generating unit describe above with reference to FIGS. 1 and 2.

As shown in FIG. 3, if the test address signals TRG01_A<0:3>, TRG234_A<0:7> and TRG56_A<0:3> comprise a plurality of addresses, a plurality of logic combinations are available. For example, if the test address signals TRG01_A<0:3>, TRG234_A<0:7> and TRG56_A<0:3> comprise sixteen predecoded signals, a total of 128 address combinations are available. In this case, the first test mode signal generating unit 100 can include 127 signal generating units (not shown) and a second mode conversion signal generating unit 110. The respective first test mode signals TM1 generated from the 127 signal generating units instruct a semiconductor apparatus to enter into different test modes. The second mode conversion signal generating unit 110 enables the second mode conversion signal mode2 when the predetermined combination of the test address signals TRG01_A<0:3>, TRG234_A<0:7> and TRG56_A<0:3> is input. For example, the second mode conversion signal generating unit 110 enables the second mode conversion signal mode2 when, among various possible combinations, the test address signals TRG01_A<0:3>, TRG234_A<0:7> and TRG56_A<0:3> that have been assigned to the second mode conversion signal generating unit 110 are enabled.

Like the first test mode signal generating unit 100, the second test mode signal generating unit 200 receives test address signals TRG01_B<0:3>, TRG234_B<0:7> and TRG56_B<0:3> to generate a second test mode signal TM2 and enables a first mode conversion signal mode1 when a predetermined combination of the test address signals TRG01_B<0:3>, TRG234_B<0:7> and TRG56_B<0:3> are input.

The test address signals TRG01_A<0:3>, TRG234_A<0:7> and TRG56_A<0:3> can be the same signals as the test address signals TRG01_B<0:3>, TRG234_B<0:7> and TRG56_B<0:3>. That is, the former test address signals TRG01_A<0:3>, TRG234_A<0:7> and TRG56_A<0:3> and the latter test address signals TRG01_B<0:3>, TRG234_B<0:7> and TRG56_B<0:3> can be the same signals that are generated by decoding address signals MREG<0:6> applied through pads. However, since a test address generating unit 320, which will be described later, selectively transfers the former test address signals and the latter test address signals to the first and second test mode signal generating units 100 and 200, respectively, different reference symbols are given to the test address signals.

The second test mode signal generating unit 200 may include one or more signal generating units (not shown) configured to generate the second test mode signal TM2 in response to the test address signals TRG01_B<0:3>, TRG234_B<0:7> and TRG56_B<0:3>. The second test most signal generating unit 200 may include a first mode conversion signal generating unit 210 configured to generate the first mode conversion signal mode1 in response to the predetermined combination of the test address signals TRG01_B<0:3>, TRG234_B<0:7> and TRG56_B<0:3>. If the test address signals TRG01_B<0:3>, TRG234_B<0:7> and TRG56_B<0:3> of the second test mode signal generating unit 200 comprise a plurality of addresses, a plurality of logic combinations are available. In an exemplary embodiment, the second test mode signal generating unit 200 can include 127 signal generating units (not shown) and a first mode conversion signal generating unit 210. The respective second test mode signals TM2 generated from the 127 signal generating units can instruct a semiconductor apparatus to enter into different test modes. The first mode conversion signal generating unit 210 enables the first mode conversion signal mode1 when the predetermined combination of the test address signals TRG01_B<0:3>, TRG234_B<0:7> and TRG56_B<0:3> is input.

The first and second mode conversion signals mode1 and mode2 are signals that designate a first test mode and a second test mode, respectively. That is, if the first mode conversion signal mode1 is enabled, the first test mode is set, and the first test mode signal generating unit 100 is enabled. The first test mode signal TM1 is then enabled in response to the test address signals TRG01_A<0:3>, TRG234_A<0:7> and TRG56_A<0:3>. Therefore, in the first test mode, the test operation can be performed in response to the first test mode signal TM1.

In a similar manner, if the second mode conversion signal mode2 is enabled, the second test mode is set, and the second test mode signal generating unit 200 is enabled. The second test mode signal TM2 is enabled in response to the test address signals TRG01_B<0:3>, TRG234_B<0:7> and TRG56_B<0:3>. Therefore, in the second test mode, the test operation can be performed in response to the second test mode signal TM2. Accordingly, the first and second mode conversion signals mode1 and mode2 are signals that selectively enable the first and second test mode signal generating units 100 and 200, respectively.

In the conventional test mode signal generating device described above with reference to FIGS. 1 and 2, only a total of 128 different test modes are possible when the test address signals TRG01<0:3>, TRG234<0:7> and TRG56<0:3> comprised a total of sixteen signals. However, the test mode signal generating device 1 of the present disclosure can convert the first and second test modes to each other using the first and second mode conversion signals mode1 and mode2. This may allow the semiconductor apparatus to enter into a total of 254 different test modes, which is about twice the number of available test modes in the device of FIGS. 1 and 2.

The test control unit 300 receives address signals MREG<0:6>, a power-up signal PWRUP, a test MRS signal TMRSP, and a normal MRS signal NMRSP through pads. The power-up signal PWRUP is a signal that is enabled to perform an initialization operation of the semiconductor apparatus immediately after power is applied to the semiconductor apparatus. The test MRS signal TMRSP is a signal that instructs the semiconductor apparatus to perform the test operation, and the normal MRS signal NMRSP is a signal that instructs the semiconductor apparatus to perform a normal operation which is not the test operation. The test MRS signal TMRSP and the normal MRS signal NMRSP can be generated from a mode register set (MRS) of the semiconductor apparatus.

The test control unit 300 decodes the address signals MREG<0:6> to generate the test address signals TRG01<0:3>, TRG234<0:7> and TRG56<0:3>, and selectively transfers the test address signals TRG01<0:3>, TRG234<0:7> and TRG56<0:3> to one of the first and second test mode signal generating units 100 and 200 in response to the second mode conversion signal mode2. In FIG. 3, as described above, although different reference symbols are used to designate the test address signals TRG01_A<0:3>, TRG234_A<0:7> and TRG56_A<0:3> for the first test mode signal generating unit 100 and the test address signals TRG01_B<0:3>, TRG234_B<0:7> and TRG56_B<0:3> for the second test mode signal generating unit 200, these signals can be substantially the same as the test address signals TRG01<0:3>, TRG234<0:7> and TRG56<0:3>.

As shown in FIG. 3, the test control unit 300 may include a control unit 310 and a test address generating unit 320. If one or both of the power-up signal PWRUP and the normal MRS signal NMRSP are enabled, the control unit 310 enables a reset signal TRSTPB and disables all of transfer address signals TMREG<0:6> regardless of the address signals MREG<0:6>. The control unit 310 generates the transfer address signals TMREG<0:6> in response to the address signals MREG<0:6> if both of the power-up signal PWRUP and the normal MRS signal NMRSP are disabled and the test MRS signal TMRSP is enabled. That is, the control unit 310 transfers the received address signals MREG<0:6> in the test operation of the semiconductor apparatus and substantially inhibits the received address signals MREG<0:6> from being transferred in the initialization operation or in the normal operation of the semiconductor apparatus. In addition, the reset signal TRSTPB is enabled when the normal MRS signal NMRSP that instructs the semiconductor apparatus to perform the normal operation is enabled. Accordingly, the reset signal TRSTPB can be input to the first and second test mode signal generating units 100 and 200 to reset the first and second test mode signal generating units 100 and 200, respectively, and thus can stop the first and second test mode signal generating units 100 and 200 from generating the first and second test mode signals TM1 and TM2, respectively.

In the test operation of the semiconductor apparatus, the test address generating unit 320 receives the transfer address signals TMREG<0:6> to generate the test address signals TRG01<0:3>, TRG234<0:7> and TRG56<0:3>. The test address generating unit 320 predecodes the transfer address signals TMREG<0:6>. For example, as shown in FIG. 3, if 7 transfer address signals TMREG<0:6> are input from the control unit 310, the test address generating unit 320 can predecode the transfer address signals TMREG<0:6> to generate a total of 16 test address signals TRG01<0:3>, TRG234<0:7> and TRG56<0:3>. That is, the test address generating unit 320 can decode the transfer address signals TMREG<0:1> to generate the test address signals TRG01<0:3>, can decode the transfer address signals TMREG<2:4> to generate the test address signals TRG234<0:7>, and can decode the transfer address signals TMREG<5:6> to generate the test address signals TRG56<0:3>. However, it should be understood that the number of address signals is not limited thereto.

The test address generating unit 320 selectively transfers the test address signals TRG01<0:3>, TRG234<0:7> and TRG56<0:3> to the first and second test mode signal generating units 100 and 200 based on whether the second mode conversion signal mode2 is enabled or not. Since the second mode conversion signal mode2 is disabled in the first test mode and is enabled in the second test mode, the test address generating unit 320 can transfer the test address signals TRG01<0:3>, TRG234<0:7> and TRG56<0:3> to the first test mode signal generating unit 100 in the first test mode, and can transfer the test address signals TRG01<0:3>, TRG234<0:7> and TRG56<0:3> to the second test mode signal generating unit 200 in the second test mode.

Figure 4:
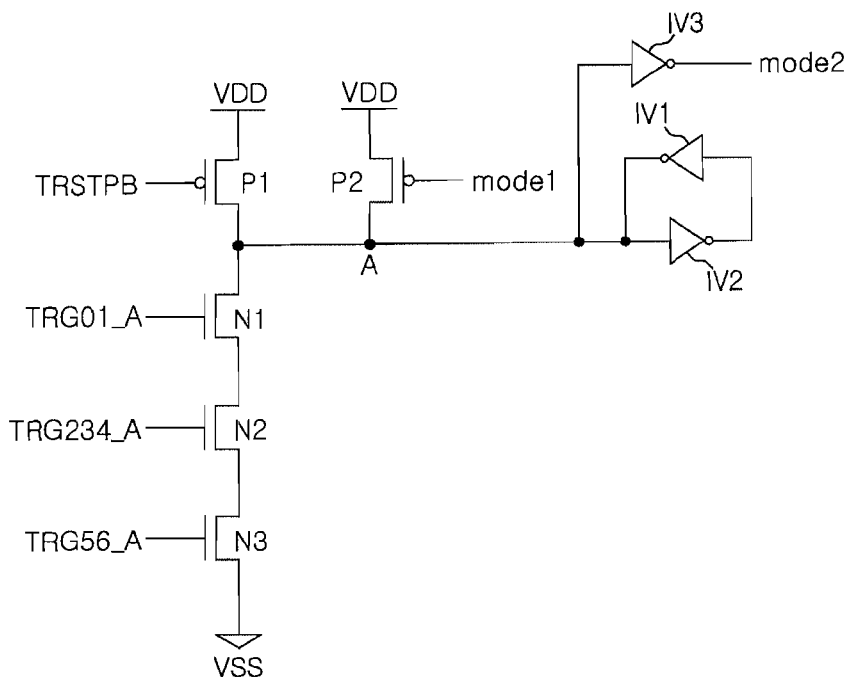
FIG. 4 is a diagram showing an exemplary configuration of the second mode conversion signal generating unit of FIG. 3.

FIG. 4 is a diagram showing an exemplary configuration of the second mode conversion signal generating unit 110 of FIG. 3. Referring to FIG. 4, the second mode conversion signal generating unit 110 enables the second mode conversion signal mode2 when the predetermined combination of the test address signals TRG01_A, TRG234_A and TRG56_A, which can be specified by assigning arbitrary test address signals, are received. The second mode conversion signal generating unit 110 disables the second mode conversion signal mode2 when one or both of the reset signal TRSTPB and the first mode conversion signal mode1 are enabled.

As shown in FIG. 4, the second mode conversion signal generating unit 110 includes first and second PMOS transistors P1 and P2, first to third NMOS transistors N1 to N3, and first to third inverters IV1 to IV3. The first PMOS transistor P1 receives the reset signal TRSTPB through its gate terminal and applies an external voltage VDD to a first node A when the reset signal TRSTPB is enabled at a logic low level. The second PMOS transistor P2 receives the first mode conversion signal mode1 through its gate terminal and applies the external voltage VDD to the first node. A when the first mode conversion signal mode1 is enabled at a logic low level. A drain terminal of the first NMOS transistor N1 is coupled to the first node A, a source terminal of the third NMOS transistor N3 is coupled to a ground voltage VSS, and source terminals and drain terminals of the first to third NMOS transistors N1 to N3 are coupled in series. The first to third NMOS transistors N1 to N3 receive the test address signals TRG01_A, TRG234_A and TRG56_A assigned to them through their gate terminals, respectively. Therefore, when all of the assigned test address signals TRG01_A, TRG234_A and TRG56_A are enabled, all of the first to third NMOS transistors N1 to N3 are turned on, and thus the ground voltage VSS is applied to the first node A. The first and second inverters IV1 and IV2 are coupled in a latch configuration to latch a voltage level of the first node A. The third inverter IV3 outputs an inverted signal of the voltage level of the first node A as the second mode conversion signal mode2.

Still referring to FIG. 4, an operation of the second mode conversion signal generating unit 110 will be described in more detail. When all of the assigned test address signals TRG01_A, TRG234_A and TRG56_A are enabled and then all of the first to third NMOS transistors N1 to N3 are turned on, the first node A changes to the ground voltage (VSS) level, and the third inverter IV3 outputs the second mode conversion signal mode2 enabled at a logic high level. The second mode conversion signal mode2 substantially maintains its enable state until one or both of the reset signal TRSTPB and the first mode conversion signal mode1 are enabled. Thereafter, when one or both of the reset signal TRSTPB and the first mode conversion signal mode1 are enabled at a logic low level, one or both of the first and second PMOS transistors P1 and P2 are turned on, and thus the first node A changes to the external voltage (VDD) level. Therefore, the third inverter IV3 can generate the second mode conversion signal mode2 that is disabled at a logic low level.

Figure 5:
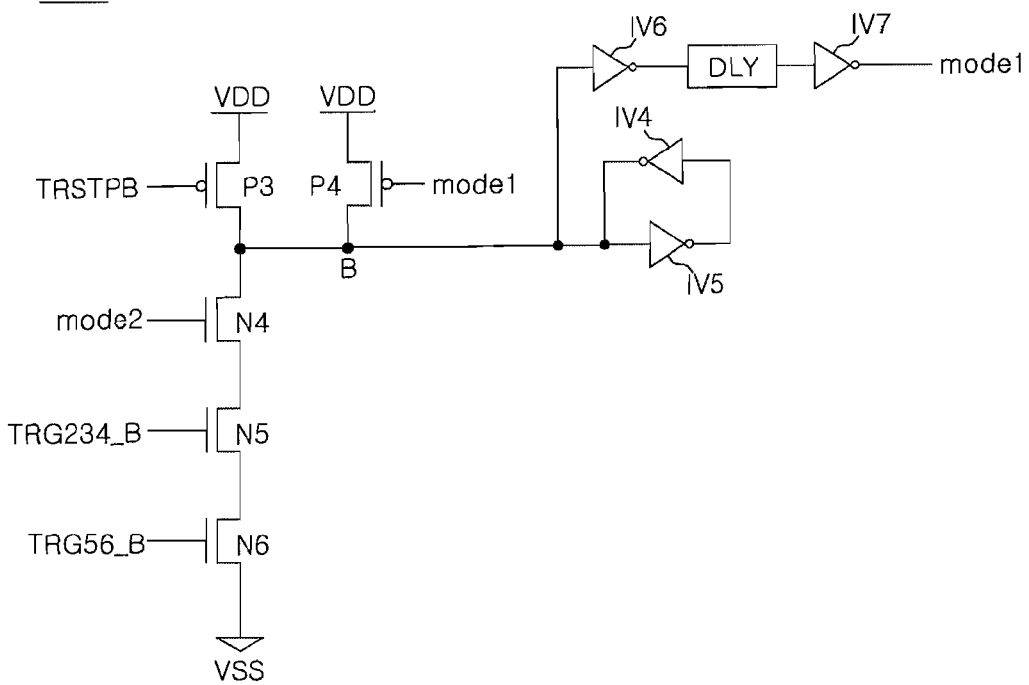
FIG. 5 is a diagram showing an exemplary configuration of the first mode conversion signal generating unit of FIG. 3.

FIG. 5 is a diagram showing an exemplary configuration of the first mode conversion signal generating unit 210 of FIG. 3. Referring to FIG. 5, the first mode conversion signal generating unit 210 enables the first mode conversion signal mode1 when the predetermined combination of the test address signals TRG01_B<0:3>, TRG234_B<0:7> and TRG56_B<0:3> are received. When the second mode conversion signal mode2 substantially maintains its enabled state and the assigned test address signals TRG234_B and TRG56_B are enabled, the first mode conversion signal generating unit 210 enables the first mode conversion signal mode1. The first mode conversion signal generating unit 210 disables the first mode conversion signal mode1 when the reset signal TRSTPB is enabled and disables the first mode conversion signal mode1 immediately after the first mode conversion signal mode1 is enabled. That is, the first mode conversion signal generating unit 210 is configured to enable the first mode conversion signal mode1 in a pulse form.

As shown in FIG. 5, the first mode conversion signal generating unit 210 includes third and fourth PMOS transistors P3 and P4, fourth to sixth NMOS transistors N4 to N6, fourth to seventh inverters IV4 to IV7, and a delay unit DLY. The third PMOS transistor P3 receives the reset signal TRSTPB through its gate terminal and is turned on to apply the external voltage VDD to a second node B when the reset signal TRSTPB is enabled at a logic low level. The fourth PMOS transistor P4 receives the first mode conversion signal mode1 through its gate terminal and is turned on to apply the external voltage VDD to the second node B when the first mode conversion signal mode1 is enabled at a logic low level. The fourth NMOS transistor N4 receives the second mode conversion signal mode2 through its gate terminal, and the fifth and sixth NMOS transistors N5 and N6 receive the assigned test address signals TRG234_B and TRG56_B through their gate terminals, respectively. The fourth to sixth NMOS transistors N4 to N6 are coupled in series between the second node B and the ground voltage VSS. The fourth and fifth inverters IV4 and IV5 are coupled in a latch configuration to latch a voltage level of the second node B. The sixth inverter IV6, the delay unit DLY, and the seventh inverter IV7 generate the first mode conversion signal mode1, which has substantially the same voltage level as that of the second node B.

Referring to FIGS. 4 and 5, an operation of the first mode conversion signal generating unit 210 will be described. When the second mode conversion signal mode2 substantially maintains its enabled state and the assigned test address signals TRG234_B and TRG56_B are enabled, the second node B changes to the ground voltage (VSS) level. Therefore, after a predetermined delay time, the first mode conversion signal generating unit 210 can generate the first mode conversion signal mode1, which is enabled at a logic low level. When the first mode conversion signal mode1 is enabled at a logic low level, the second mode conversion signal mode2 is disabled at a logic low level by the second mode conversion signal generating unit 110, and thus the ground voltage VSS is not applied to the second node B any more. In addition, when the first mode conversion signal mode1 is enabled at a logic low level, the fourth PMOS transistor P4 is turned on, the second node B changes to the external voltage (VDD) level, and the first mode conversion signal mode1 is disabled to a logic high level. That is, the first mode conversion signal mode1, which may have a pulse width as wide as a delay time of the delay unit DLY, is generated.

As described above, when the test address signals TRG01_A, TRG234_A and TRG56_A assigned to the second mode conversion signal generating unit 110 are enabled, the second mode conversion signal generating unit 110 enables the second mode conversion signal mode2 and terminates the first test mode. The first mode conversion signal generating unit 210 enables the first mode conversion signal mode1 in response to the assigned test address signals TRG234_B and TRG56_B and the second mode conversion signal mode2. Subsequently, the second mode conversion signal mode2 is disabled, and the second test mode can be terminated.

The above-described first and second mode conversion signal generating units 210 and 110 are provided by way of example only. It should be understood that the disclosed embodiments are intended to include all configurations that can select one of the first and second test mode signal generating units to generate the first or second test mode signal without extra control signal by using the test address signals to generate the test mode signal, i.e., all configurations that can select the first and second test modes.

Figure 6:
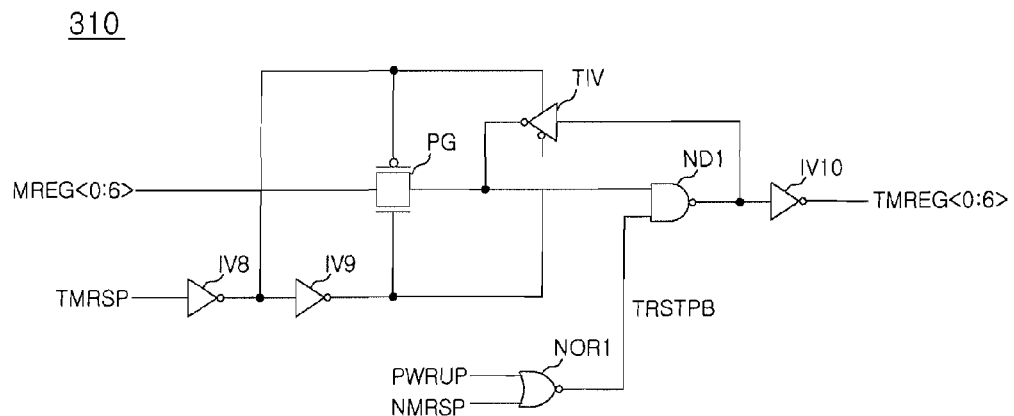
FIG. 6 is a diagram showing an exemplary configuration of the control unit of FIG. 3.

FIG. 6 is a diagram showing an exemplary configuration of the control unit 310 of FIG. 3. As shown in FIG. 6, the control unit 310 includes eighth to tenth inverters IV8 to IV10, a pass gate PG, a tri-state inverter TIV, a first NOR gate NOR1 and a first NAND gate ND1. The pass gate PG is controlled by the test MRS signal TMRSP and determines whether or not to transfer the address signals MREG<0:6> therethrough. The pass gate PG transfers the address signals MREG<0:6> if the test MRS signal TMRSP is enabled, but does not transfer the address signals MREG<0:6> if the test MRS signal TMRSP is disabled.

The first NOR gate NOR1 receives the power-up signal PWRUP and the normal MRS signal NMRSP. The first NOR gate NOR1 generates the reset signal TRSTPB that is enabled at a logic low level if one or both of the power-up signal PWRUP and the normal MRS signal NMRSP are enabled. The first NAND gate ND1 receives the address signals MREG<0:6> transferred through the pass gate PG and the reset signal TRSTPB. The first NAND gate ND1 inverts the address signals MREG<0:6> transferred through the pass gate PG if the reset signal TRSTPB is disabled at a logic high level and maintains the transferred address signals MREG<0:6> to a disabled state if the reset signal TRSTPB is enabled at a logic low level.

When the test MRS signal TMRSP is disabled, the tri-state inverter TIV functions as an inverter to latch the address signals MREG<0:6> transferred through the pass gate PG. The tenth inverter IV10 inverts an output of the first NAND gate ND1 to output the transfer address signals TMREG<0:6>. The transfer address signals TMREG<0:6> are then transferred to the test address generating unit 320. That is, the control unit 310 generates the transfer address signals TMREG<0:6> to transfer the transfer address signals TMREG<0:6> to the test address generating unit 320 when the test MRS signal TMRSP is enabled and the reset signal TRSTPB is disabled. The control unit 310 maintains all of the transfer address signals TMREG<0:6> to a logic low level regardless of levels of the address signals MREG<0:6> when the reset signal TRSTPB is enabled.

Figure 7:
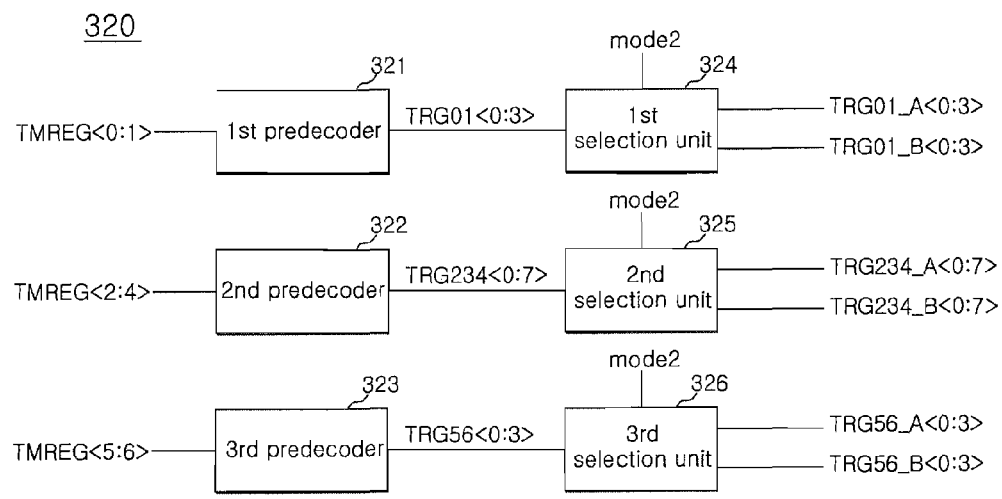
FIG. 7 is a block diagram schematically illustrating an exemplary configuration of the test address generating unit of FIG. 3.

FIG. 7 is a block diagram schematically illustrating an exemplary configuration of the test address generating unit 320 of FIG. 3. As shown in FIG. 7, the test address generating unit 320 includes first to third predecoders 321 to 323 and first to third selection units 324 to 326. The first to third predecoders 321 to 323 predecode the corresponding transfer address signals TMREG<0:1>, TMREG<2:4> and TMREG<5:6> to generate the test address signals TRG01<0:3>, TRG234<0:7> and TRG56<0:3>, respectively. The first to third selection units 324 to 326 selectively transfer the test address signals TRG01<0:3>, TRG234<0:7> and TRG56<0:3>, respectively, to the first and second test mode signal generating units 100 and 200 in response to the second mode conversion signal mode2. The first to third predecoders 321 to 323 can be implemented by using any conventional decoding circuit that decodes address signals. The first to third selection units 324 to 326 can have substantially the same configuration. An exemplary configuration of the first selection unit 324 is shown in FIG. 8.

Referring to FIG. 8, the first selection unit 324 can include first and second AND gates AND1 and AND2. The second AND gate AND2 can transfer the test address signals TRG01_B<0:3> to the second test mode signal generating unit 200 if the second mode conversion signal mode2 is enabled. The first AND gate AND1 can transfer the test address signals TRG01_A<0:3> to the first test mode signal generating unit 100 in response to an inverted signal mode2B of the second mode conversion signal mode2 if the second mode conversion signal mode2 is disabled.

FIG. 9 is a timing diagram showing an exemplary operation of a test mode signal generating device 1 according to certain embodiments. Referring to FIGS. 3 to 9, an operation of the test mode signal generating device 1 will be described in more detail.

When power is initially applied to the semiconductor apparatus and the initialization operation is finished, the power-up signal PWRUP is disabled to a logic low level. To allow the semiconductor apparatus to perform the test operation, the test MRS signal TMRSP is applied in a pulse form, and the normal MRS signal NMRSP substantially maintains its disabled state. The control unit 310 generates the transfer address signals TMREG<0:6> in response to the address signals MREG<0:6> and transfers them to the test address generating unit 320. The test address generating unit 320 then decodes the transfer address signals TMREG<0:6> to generate the test address signals TRG01<0:3>, TRG234<0:7> and TRG56<0:3>. At this time, since the second mode conversion signal mode2 is at its disabled state, the test address generating unit 320 transfers the test address signals TRG01_A<0:3>, TRG234_A<0:7> and TRG56_A<0:3> to the signal generating units (not shown) of the first test mode signal generating unit 100. The respective signal generating units generate the first test mode signal TM1 in response to the test address signals TRG01_A<0:3>, TRG234_A<0:7> and TRG56_A<0:3> assigned to them.

In FIG. 9, arbitrary combinations of the test address signals TRG01_A<0:3>, TRG234_A<0:7> and TRG56_A<0:3> are represented as TRG_A, and arbitrary combinations of the test address signals TRG01_B<0:3>, TRG234_B<0:7> and TRG56_B<0:3> are represented as TRG_B. Referring to FIG. 9, when the second mode conversion signal mode2 is disabled, the test address signal TRG_A is transferred to the first test mode signal generating unit 100. The signal generating unit of the first test mode signal generating unit 100 then enables the corresponding first test mode signal TM1 in response to the test address signal TRG_A.

When an address signal MREG that enables the test address signal TRG_A assigned to the second mode conversion signal generating unit 110 is input, the second mode conversion signal mode2 is enabled. The test address generating unit 320 transfers the test address signal TRG_B to the signal generating units (not shown) of the second test mode signal generating unit 200 in response to the enabled second mode conversion signal mode2. Therefore, the test address generating unit 320 can enable the second test mode signal TM2 by applying substantially the same test address signal TRG_B as the test address signal TRG_A to the signal generating units (not shown) of the second test mode signal generating unit 200.

When the test address signal TRG_B assigned to the first mode conversion signal generating unit 210 is enabled, the first mode conversion signal mode1 is enabled to a logic low level. When the first mode conversion signal mode1 is enabled, the second mode conversion signal generating unit 110 disables the second mode conversion signal mode2 and substantially maintains the disable state. The test address generating unit 320 applies the test address signal TRG_A to the first test mode signal generating unit 100 in response to the disabled second mode conversion signal mode2. Therefore, the first test mode signal generating unit 100 generates the first test mode signal TM1 in response to the test address signal TRG_A.

To allow the semiconductor apparatus to finish the test operation and perform the normal operation, the normal MRS signal NMRSP is enabled. When the normal MRS signal NMRSP is enabled, the control unit 310 enables the reset signal TRSTPB, and the first and second test mode signals TM1 and TM2, which are generated from the first and second test mode signal generating units 100 and 200, respectively, are disabled together. Therefore, all of the test operations can be finished.

The disclosed embodiments of the invention can select the first test mode and the second test mode by using the test address signals. As a result, when a limited number of address signals are used, the disclosed embodiments can generate a greater number of distinct test mode signals (e.g., two or more times) than that typically available in the conventional art.

While the embodiments disclosed above can generate about twice as many distinct test mode signals as that of the conventional art, it should be understood that various other embodiments may be configured to generate three times or more distinct test mode signals than that of the conventional art. Such configurations will be apparent to those skilled in the art from consideration of the disclosed embodiments and without departing from the spirit of the present invention.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A test mode signal generating device comprising:
a first test mode signal generating unit configured to receive test address signals to generate a first test mode signal when a first mode conversion signal is enabled, the first test mode signal generating unit being further configured to enable a second mode conversion signal when the test address signals correspond to a first predetermined combination; and
a second test mode signal generating unit configured to receive the test address signals to generate a second test mode signal when a second mode conversion signal is enabled, the second test mode signal generating unit being further configured to enable the first mode conversion signal when the test address signals correspond to a second predetermined combination.

2. The test mode signal generating device of claim 1, wherein the first test mode signal generating unit comprises:
a signal generating unit configured to receive the test address signals to generate the first test mode signal; and
a second mode conversion signal generating unit configured to generate the second mode conversion signal when the first predetermined combination of the test address signals are received.

3. The test mode signal generating device of claim 2, wherein the signal generating unit is configured to disable the first test mode signal when a reset signal is enabled.

4. The test mode signal generating device of claim 3, wherein the second mode conversion signal generating unit is configured to disable the second mode conversion signal when the first mode conversion signal is enabled.

5. The test mode signal generating device of claim 1, wherein the second test mode signal generating unit comprises:
a signal generating unit configured to receive the test address signals to generate the second test mode signal; and
a first mode conversion signal generating unit configured to generate the first mode conversion signal when the second predetermined combination of the test address signals are received.

6. The test mode signal generating device of claim 5, wherein the signal generating unit is configured to disable the second test mode signal when the reset signal is enabled.

7. The test mode signal generating device of claim 1, further comprising a test control unit configured to decode address signals to generate the test address signals, the test control unit further being configured to selectively transfer the test address signals to the first and second test mode signal generating units in response to the second mode conversion signal.

8. The test mode signal generating device of claim 7, wherein the test control unit comprises:
a control unit configured to transfer the address signals when a test MRS signal is enabled and to stop transferring the address signals to generate a reset signal when a normal MRS signal is enabled; and
a test address generating unit configured to decode an address transferred from the control unit to generate the test address signals, the test address generating unit being configured to selectively transfer the test address signals to the first and second test mode signal generating units in response to the second mode conversion signal.

9. A test mode signal generating device comprising:
a first test mode signal generating unit configured to generate a first test mode signal in response to test address signals in a first test mode; and
a second test mode signal generating unit configured to generate a second test mode signal in response to the test address signals in a second test mode, wherein the first and second test modes are capable of being converted to each other based on the test address signals,
wherein the first test mode signal generating unit is configured to instruct a conversion to the second test mode in response to the test address signals, and the second test mode signal generating unit is configured to instruct a conversion to the first test mode in response to the test address signals.

10. The test mode signal generating device of claim 9, wherein the first test mode signal generating unit comprises:
a signal generating unit configured to generate the first test mode signal in response to the test address signals; and
a second mode conversion signal generating unit configured to generate the second mode conversion signal that instructs the conversion to the second test mode when the test address signals correspond to a first predetermined combination.

11. The test mode signal generating device of claim 10, wherein the signal generating unit is configured to disable the first test mode signal when a reset signal is enabled.

12. The test mode signal generating device of claim 10, wherein the second mode conversion signal generating unit is configured to disable the second mode conversion signal when the first mode conversion signal is enabled.

13. The test mode signal generating device of claim 10, wherein the second test mode signal generating unit comprises:
a signal generating unit configured to generate the second test mode signal in response to the test address signals; and
a first mode conversion signal generating unit configured to generate the first mode conversion signal that instructs the conversion to the first test mode when the test address signals correspond to a second predetermined combination.

14. The test mode signal generating device of claim 13, wherein the signal generating unit is configured to disable the second test mode signal when a reset signal is enabled.

15. The test mode signal generating device of claim 10, further comprising a test control unit configured to decode address signals to generate the test address signals, the test control unit being further configured to selectively transfer the test address signals to the first and second test mode signal generating units in response to the second mode conversion signal.

16. The test mode signal generating device of claim 15, wherein the test control unit comprises:
   a control unit configured to transfer the address signals when a test MRS signal is enabled, and to stop transferring the address signals to generate the reset signal when a normal MRS signal is enabled; and
   a test address generating unit configured to decode an address transferred from the control unit to generate the test address signals, the test address generating unit being further configured to selectively transfer the test address signals to the first and second test mode signal generating units in response to the second mode conversion signal.

* * * * *